(12) United States Patent
Shang et al.

(10) Patent No.: US 11,900,991 B2
(45) Date of Patent: Feb. 13, 2024

(54) INTEGRATED CIRCUIT FOR MEMORY

(71) Applicant: CHANGXIN MEMORY TECHNOLOGIES, INC., Hefei (CN)

(72) Inventors: Weibing Shang, Hefei (CN); Fengqin Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 180 days.

(21) Appl. No.: 17/577,103

(22) Filed: Jan. 17, 2022

(65) Prior Publication Data

US 2022/0139447 A1    May 5, 2022

Related U.S. Application Data

(63) Continuation of application No. PCT/CN2021/104221, filed on Jul. 2, 2021.

(30) Foreign Application Priority Data

Sep. 22, 2020   (CN) .......................... 202011004212.9

(51) Int. Cl.
*G11C 11/4097* (2006.01)
*G11C 11/4091* (2006.01)
(Continued)

(52) U.S. Cl.
CPC ...... *G11C 11/4097* (2013.01); *G11C 11/4091* (2013.01); *G11C 11/4094* (2013.01); *G11C 11/4096* (2013.01)

(58) Field of Classification Search
CPC ............ G11C 11/4097; G11C 11/4091; G11C 11/4096
(Continued)

(56) References Cited

U.S. PATENT DOCUMENTS 4,802,126 A    1/1989  Takayama
4,916,669 A    4/1990  Sato
(Continued)

FOREIGN PATENT DOCUMENTS

CN    1259742 A    7/2000
CN    1937072 A    3/2007
(Continued)

OTHER PUBLICATIONS

"Trace Parasitics Analysis" [J], 1994, Li Wanhua, Internal Combustion Engine & Parts, China Academic Journal Electronic Publishing House, 3 pgs.
(Continued)

*Primary Examiner* — Huan Hoang
(74) *Attorney, Agent, or Firm* — Cooper Legal Group, LLC

(57) ABSTRACT

An integrated circuit is provided. The integrated circuit includes: a first data line group, including a plurality of local data lines arranged in an array; a second data line group, including a plurality of complementary local data lines arranged in an array, the plurality of complementary local data lines and the plurality of local data lines respectively transmitting signals having opposite phases; and a plurality of read circuits, configured to read, in response to a read control signal, signals of the local data lines or the complementary local data lines during a read operation, each of the plurality of read circuits being electrically connected to a local data line at a boundary of the first data line group or connected to a complementary local data line at a boundary of the second data line group.

20 Claims, 11 Drawing Sheets

(51) Int. Cl.
*G11C 11/4094* (2006.01)
*G11C 11/4096* (2006.01)

(58) Field of Classification Search
USPC .......................................................... 365/63
See application file for complete search history.

(56) References Cited

U.S. PATENT DOCUMENTS

| | | |
|---|---|---|
| 5,715,210 A | 2/1998 | Yoo |
| 6,317,374 B2 | 11/2001 | Feurle |
| 6,636,453 B2 | 10/2003 | Fischer |
| 7,203,102 B2 | 4/2007 | Brox |
| 7,227,799 B2 | 6/2007 | Vogelsang |
| 7,808,853 B2 | 10/2010 | Berthel |
| 2001/0002702 A1 | 6/2001 | Takemura |
| 2002/0126520 A1 | 9/2002 | Takemura |
| 2003/0142528 A1 | 7/2003 | Takemura |
| 2004/0080971 A1 | 4/2004 | Takemura |
| 2007/0159903 A1* | 7/2007 | Kim ...................... G11C 11/405 365/207 |
| 2012/0026773 A1 | 2/2012 | Lee |
| 2013/0148415 A1* | 6/2013 | Shu ......................... G11C 7/12 365/154 |

FOREIGN PATENT DOCUMENTS

| | | |
|---|---|---|
| CN | 107039055 A | 8/2017 |
| EP | 0268288 A2 | 5/1988 |

OTHER PUBLICATIONS

Supplementary European Search Report in the European application No. 21870935.0, dated Dec. 8, 2022, 10 pgs.
International Search Report in the international application No. PCT/CN2021/104221, dated Oct. 11, 2021, 2 pgs.

* cited by examiner

INTEGRATED CIRCUIT FOR MEMORY

CROSS-REFERENCE TO RELATED APPLICATIONS

This is a continuation application of International Patent Application No. PCT/CN2021/104221, filed on Jul. 2, 2021, which is based upon and claims priority to Chinese Patent Application No. 202011004212.9, filed on Sep. 22, 2020. The disclosure of International Patent Application No. PCT/CN2021/104221 and Chinese Patent Application No. 202011004212.9 are hereby incorporated by reference in their entireties.

TECHNICAL FIELD

Embodiments of the disclosure relate to the technical field of semiconductors, and in particular to an integrated circuit.

BACKGROUND

The Dynamic Random Access Memory (DRAM) is a semiconductor storage device commonly used in computers, and is composed of many repeated memory cells. Each memory cell generally includes a capacitor and a transistor. A gate of the transistor is connected to a word line, a drain is connected to a bit line, and a source is connected to the capacitor. A voltage signal on the word line can control turn-on/turn-off of the transistor, such that data information stored in the capacitor may be read through the bit line or data information may be written into the capacitor through the bit line for storage.

The DRAM may include a Double Data Rate (DDR) synchronous DRAM, a Graphics Double Data Rate (GDDR) DRAM, and a Low Power Double Data Rate (LPDDR) DRAM. As the DRAM has been applied to more and more fields, for example, the DRAM has more and more been applied to the mobile field, users have higher requirements for DRAM power consumption indicators.

However, performance of the existing DRAMs is still required to be improved.

SUMMARY

Embodiments of the disclosure provide an integrated circuit, including:

a first data line group, including a plurality of local data lines arranged in an array; a second data line group, including a plurality of complementary local data lines arranged in an array, the plurality of complementary local data lines and the plurality of local data lines respectively transmitting signals having opposite phases; and a plurality of read circuits, configured to read, in response to a read control signal, signals of the local data lines or the complementary local data lines during a read operation, each of the plurality of read circuits being electrically connected to a local data line at a boundary of the first data line group or connected to a complementary local data line at a boundary of the second data line group.

Compared with the related art, in the implementations of the disclosure, during the operating process of the integrated circuit, there is noise interference between adjacent data lines, which may even cause errors in data transmission. Since the data lines are generally arranged in an array, the data line at a boundary of the data line group may only be interfered by one adjacent data line. Each of the plurality of read circuits is electrically connected to the local data line at a boundary of the first data line group or connected to the complementary local data line at a boundary of the second data line group, so that the data lines less affected by noise are used for output conversion in the integrated circuit, thereby improving the data reliability, reducing the power consumption of the integrated circuit, and further improving the performance of the integrated circuit.

BRIEF DESCRIPTION OF THE DRAWINGS

One or more embodiments are exemplified by figures in the corresponding accompany drawings. These exemplary illustrations do not constitute any limitation to the embodiments. The elements with the same reference numerals in the accompany drawings are denoted as similar elements. Unless otherwise stated, the figures in the accompany drawings do not constitute any scale limitation.

DETAILED DESCRIPTION

It can be known from BACKGROUND that performance of DRAMs in the related art is still required to be improved.

The inventor of the disclosure finds that, for a same DRAM in the related art, there is noise interference between adjacent data lines. To reduce the area of an integrated circuit, no shield line is provided between the data lines to shield noise, resulting in large noise interference between the data lines and increasing the power consumption of the integrated circuit. That is to say, at present, there are problems that data lines of a memory are greatly affected by noise and the power consumption is high.

To resolve the above problems, embodiments of the disclosure provide an integrated circuit. Each of a plurality of read circuits is electrically connected to a local data line at a boundary of a first data line group or connected to a complementary local data line at a boundary of a second data line group, so that the data lines less affected by noise are used for output conversion in the integrated circuit, thereby reducing the power consumption of the integrated circuit and further improving the performance of the integrated circuit.

To make the objective, the technical solution, and the advantages of the embodiments of the disclosure clearer, implementations of the disclosure are described in detail below with reference to the accompanying drawings. However, persons of ordinary skill in the art may understand that, in the embodiments of the disclosure, many technical details are provided for the reader to better understand the disclosure. However, the technical solution of the disclosure may be implemented even without these technical details and various variations and modifications based on the following implementations.

Figure 1:
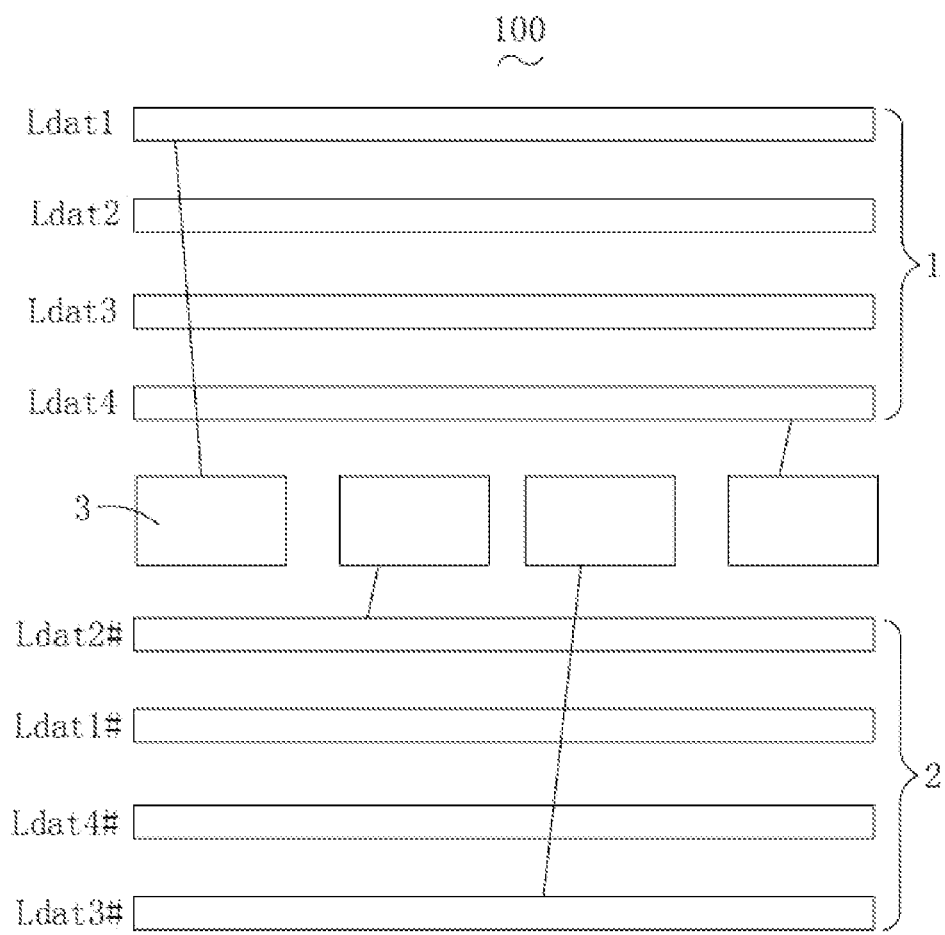
FIG. 1 illustrates a schematic structural diagram of an integrated circuit provided by an embodiment of the disclosure.

FIG. 1 illustrates an integrated circuit 100 provided by an embodiment of the disclosure.

With reference to FIG. 1, in this embodiment, the integrated circuit 100 includes: a first data line group 1, including a plurality of local data lines Ldat arranged in an array; a second data line group 2, including a plurality of complementary local data lines Ldat# arranged in an array, the plurality of complementary local data lines Ldat# and the plurality of local data lines Ldat respectively transmitting signals having opposite phases; and a plurality of read circuits 3, configured to read, in response to a read control signal, signals of the local data lines Ldat or the complementary local data lines Ldat# during a read operation. Each of the plurality of read circuits 3 is electrically connected to a local data line Ldat at a boundary of the first data line group 1 or connected to a complementary local data line Ldat# at a boundary of the second data line group 2.

Specifically, in this embodiment, data signals read or written are all paired, each pair of data signals includes two pieces of data, and in a read-write operation process, one of the two pieces of data is a high-level signal and the other one is a low-level signal. Therefore, a read-write conversion circuit at least includes a pair of a local data line Ldat and a complementary local data line Ldat#. The local data line Ldat is a local data line, and the complementary local data line Ldat# is a complementary local data line.

The read circuit 3 in this embodiment is not electrically connected to the local data line Ldat or the complementary local data line Ldat# at a non-boundary position of the first data line group 1 or the second data line group 2, but is electrically connected to the local data line Ldat at a boundary position of the first data line group 1 or the complementary local data line Ldat# at a boundary position of the second data line group 2.

Compared with the related art, in this embodiment, during the operating process of the integrated circuit 100, there is noise interference between adjacent data lines, which may even cause errors in data transmission. Since the data lines are generally arranged in an array, the data line at a boundary of the data line group may only be interfered by one adjacent data line. Each of the plurality of read circuits 3 is electrically connected to the local data line Ldat at a boundary of the first data line group 1 or connected to the complementary local data line Ldat# at a boundary of the second data line group 2, so that the data lines less affected by noise are used for output conversion in the integrated circuit 100, thereby improving the data reliability, reducing the power consumption of the integrated circuit 100, and further improving the performance of the integrated circuit 100.

It should be noted that, in the integrated circuit 100 illustrated in FIG. 1, the first data line group 1 includes four local data lines Ldat, and the second data line group 2 includes four complementary local data lines Ldat#. In practical application, the number of the local data lines Ldat in the first data line group and the number of the complementary local data lines Ldat# in the second data line group 2 are not specifically limited in this embodiment, and may be set depending on actual requirements.

With continued reference to FIG. 1, the first data line group 1 includes a first local data line Ldat1, a second local data line Ldat2, a third local data line Ldat3, and a fourth local data line Ldat4 arranged in sequence, the second data line group 2 includes a second complementary local data line Ldat#2, a first complementary local data line Ldat#1, a fourth complementary local data line Ldat#4, and a third complementary local data line Ldat#3 arranged in sequence, and the first local data line Ldat1, the fourth local data line Ldat4, the second complementary local data line Ldat#2, and the third complementary local data line Ldat#3 are electrically connected to the read circuits 3, respectively. The first local data line Ldat1 and the first complementary local data line Ldat#1, the second local data line Ldat2 and the second complementary local data line Ldat#2, the third local data line Ldat3 and the third complementary local data line Ldat#3, and the fourth local data line Ldat4 and the fourth complementary local data line Ldat#4 each transmit signals having opposite phases.

In a possible embodiment, the plurality of local data lines Ldat are equally spaced apart; and/or the plurality of complementary local data lines Ldat# are equally spaced apart.

Figure 2:
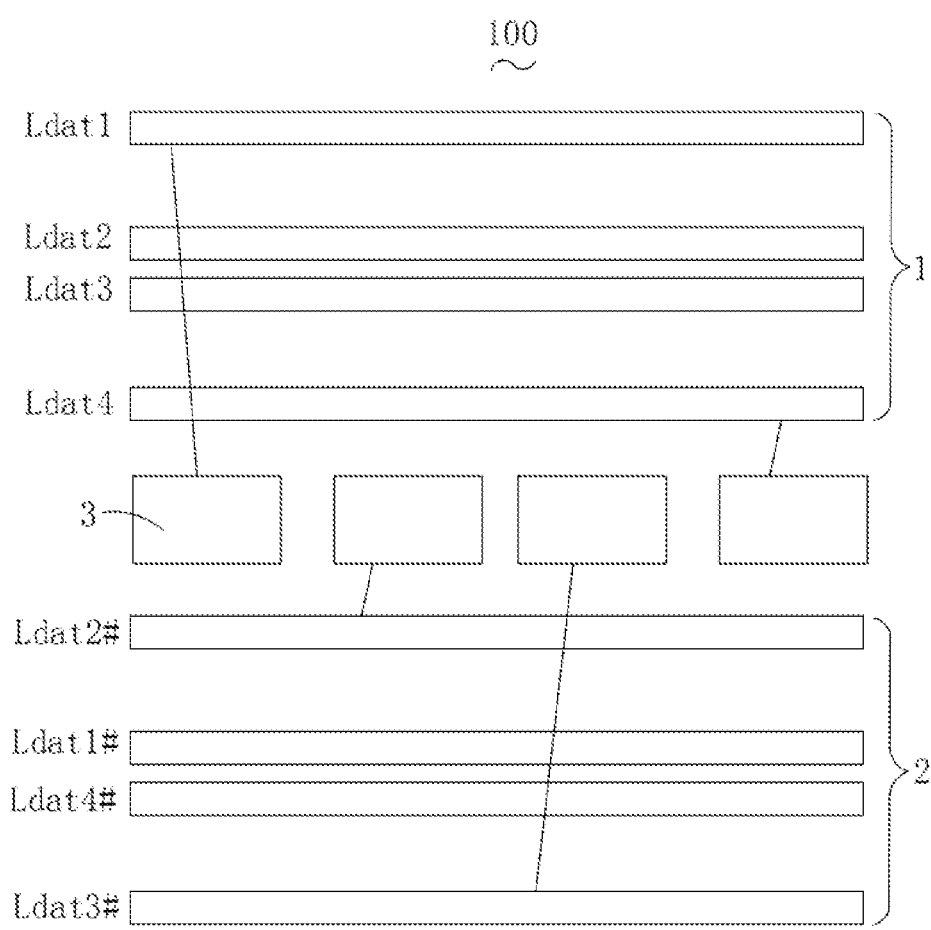
FIG. 2 illustrates another schematic structural diagram of an integrated circuit provided by an embodiment of the disclosure.

In another possible embodiment, with reference to FIG. 2, the spacing between the first local data line Ldat1 and the second local data line Ldat2 is greater than the spacing between the second local data line Ldat2 and the third local data line Ldat3, and the spacing between the third local data line Ldat3 and the fourth local data line Ldat4 is greater than the spacing between the second local data line Ldat2 and the third local data line Ldat3. The first local data line Ldat1 and the fourth local data line Ldat4 are located at the boundary positions of the first data line group 1, i.e., two read circuits 3 are respectively connected to the first local data line Ldat1 and the fourth local data line Ldat4, and thus through such a structure, the capacitance between the first local data line Ldat1 and the second local data line Ldat2 and the capacitance between the third local data line Ldat3 and the fourth local data line Ldat4 may be reduced by increasing the spacing between the first local data line Ldat1 and the second local data line Ldat2 and increasing the spacing between the third local data line Ldat3 and the fourth local data line Ldat4, so as to further reduce the noise effect of the second local data line Ldat2 on the first local data line Ldat1 and reduce the noise effect of the third local data line Ldat3 on the fourth local data line Ldat4, thereby further reducing the noise interference.

It should be noted that, in this embodiment, the spacing between the second local data line Ldat2 and the third local data line Ldat3 can be designed as the smallest spacing that can be implemented technically, so as to enable the spacing between the first local data line Ldat1 and the second local data line Ldat2 and the spacing between the third local data line Ldat3 and the fourth local data line Ldat4 to be maximum, thereby minimizing the noise effect of the second local data line Ldat2 on the first local data line Ldat1 and the noise effect of the third local data line Ldat3 on the fourth local data line Ldat4.

It should be noted that, as illustrated in FIG. 2, the spacing between the first local data line Ldat1 and the second local data line Ldat2 is greater than the spacing between the second local data line Ldat2 and the third local data line Ldat3, and the spacing between the third local data line Ldat3 and the fourth local data line Ldat4 is greater than the spacing between the second local data line Ldat2 and the third local data line Ldat3. In the practical application, it is also allowable that the spacing between the first local data line Ldat1 and the second local data line Ldat2 is greater than the spacing between the second local data line Ldat2 and the third local data line Ldat3, and the spacing between the third local data line Ldat3 and the fourth local data line Ldat4 is equal to the spacing between the second local data line Ldat2 and the third local data line Ldat3; or, the spacing between the first local data line Ldat1 and the second local data line Ldat2 is equal to the spacing between the second local data line Ldat2 and the third local data line Ldat3, and the spacing between the third local data line Ldat3 and the fourth local data line Ldat4 is greater than the spacing between the second local data line Ldat2 and the third local data line Ldat3. That is to say, the relative positional relationship between the data lines in the first data line group 1 is not specifically limited in this embodiment.

Figure 3:
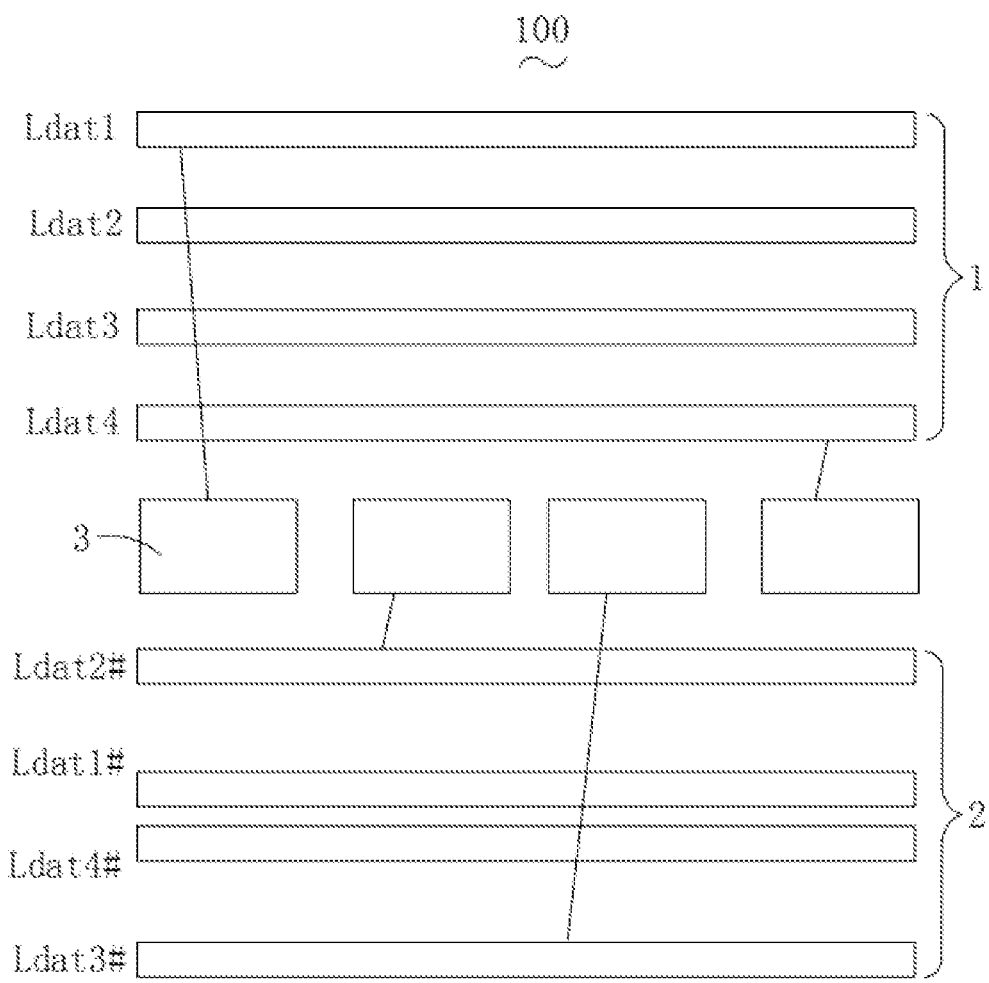
FIG. 3 illustrates another schematic structural diagram of an integrated circuit provided by an embodiment of the disclosure.

In another possible embodiment, with reference to FIG. 3, the spacing between the second complementary local data line Ldat#2 and the first complementary local data line Ldat#1 is greater than the spacing between the first complementary local data line Ldat#1 and the fourth complementary local data line Ldat#4, and the spacing between the fourth complementary local data line Ldat#4 and the third complementary local data line Ldat#3 is greater than the spacing between the first complementary local data line Ldat#1 and the fourth complementary local data line Ldat#4. Since the second complementary local data line Ldat#2 and the third complementary local data line Ldat#3 are located at the boundary positions of the second data line group 2, i.e., two read circuits 3 are respectively connected to the second complementary local data line Ldat#2 and the third complementary local data line Ldat#3. Through such a structure, the capacitance between the second complementary local data line Ldat#2 and the first complementary local data line Ldat#1 and the capacitance between the fourth complementary local data line Ldat#4 and the third complementary local data line Ldat#3 may be reduced by increasing the spacing between the second complementary local data line Ldat#2 and the first complementary local data line Ldat#1 and increasing the spacing between the fourth complementary local data line Ldat#4 and the third complementary local data line Ldat#3, so as to further reduce the noise effect of the first complementary local data line Ldat#1 on the second complementary local data line Ldat#2 and reduce the noise effect of the fourth complementary local data line Ldat#4 on the third complementary local data line Ldat#3, thereby further reducing the noise interference.

It should be noted that, in this embodiment, the spacing between the first complementary local data line Ldat#1 and the fourth complementary local data line Ldat#4 can be designed as the smallest spacing that can be implemented technically, so as to enable the spacing between the second complementary local data line Ldat#2 and the first complementary local data line Ldat#1 and the spacing between the fourth complementary local data line Ldat#4 and the third complementary local data line Ldat#3 to be maximum, thereby minimizing the noise effect of the first complementary local data line Ldat#1 on the second complementary local data line Ldat#2 and the noise effect of the fourth complementary local data line Ldat#4 on the third complementary local data line Ldat#3.

It should be noted that, as illustrated in FIG. 3, the spacing between the second complementary local data line Ldat#2 and the first complementary local data line Ldat#1 is greater than the spacing between the first complementary local data line Ldat#1 and the fourth complementary local data line Ldat#4, and the spacing between the fourth complementary local data line Ldat#4 and the third complementary local data line Ldat#3 is greater than the spacing between the first complementary local data line Ldat#1 and the fourth complementary local data line Ldat#4. In the practical application, it is also allowable that the spacing between the second complementary local data line Ldat#2 and the first complementary local data line Ldat#1 is greater than the spacing between the first complementary local data line Ldat#1 and the fourth complementary local data line Ldat#4, and the spacing between the fourth complementary local data line Ldat#4 and the third complementary local data line Ldat#3 is equal to the spacing between the first complementary local data line Ldat#1 and the fourth complementary local data line Ldat#4; or, the spacing between the second complementary local data line Ldat#2 and the first complementary local data line Ldat#1 is equal to the spacing between the first complementary local data line Ldat#1 and the fourth complementary local data line Ldat#4, and the spacing between the fourth complementary local data line Ldat#4 and the third complementary local data line Ldat#3 is greater than the spacing between the first complementary local data line Ldat#1 and the fourth complementary local data line Ldat#4. That is to say, the relative positional relationship between the data lines in the second data line group 2 is not specifically limited in this embodiment.

Figure 4:
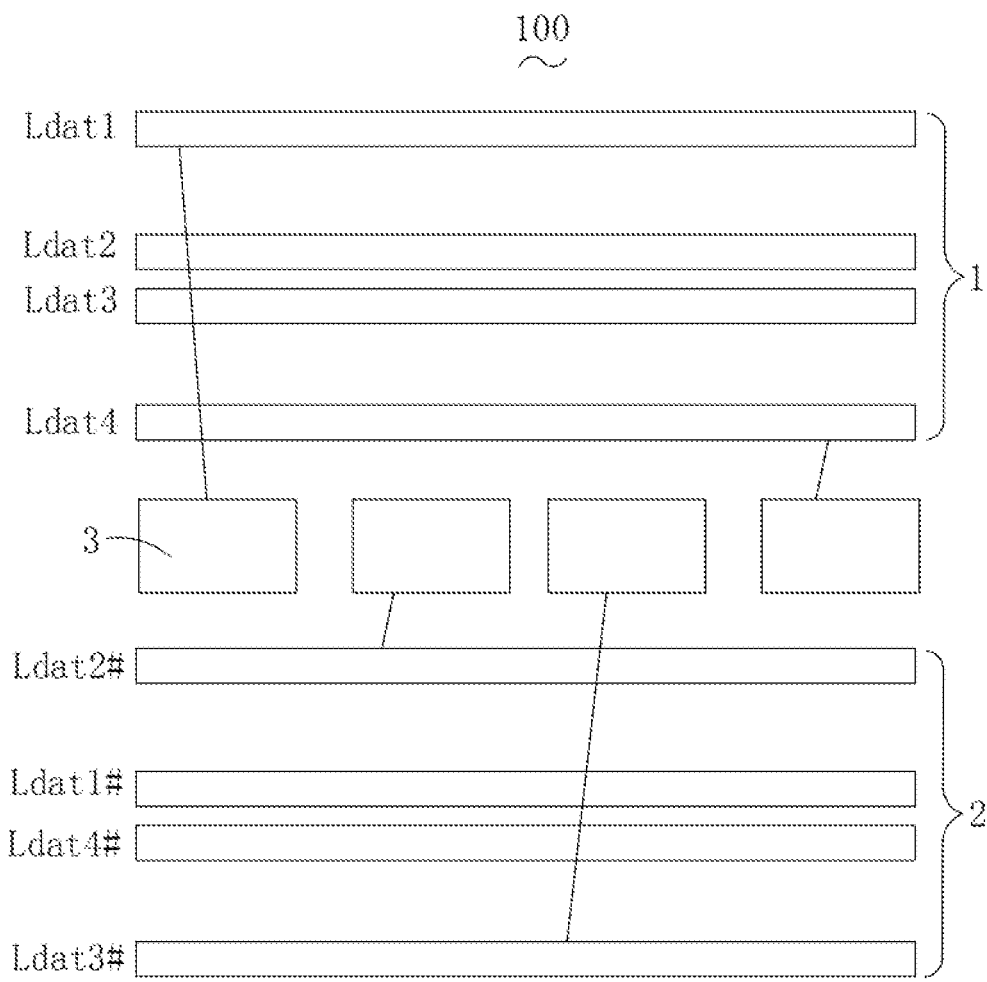
FIG. 4 illustrates another schematic structural diagram of an integrated circuit provided by an embodiment of the disclosure.

With reference to FIG. 4, to enable the noise interference on the integrated circuit 100 smaller, by combining the set positions of the data lines in FIG. 2 and FIG. 3, the spacing between the first local data line Ldat1 and the second local data line Ldat2 is greater than the spacing between the second local data line Ldat2 and the third local data line Ldat3, the spacing between the third local data line Ldat3 and the fourth local data line Ldat4 is greater than the spacing between the second local data line Ldat2 and the third local data line Ldat3, the spacing between the second complementary local data line Ldat#2 and the first complementary local data line Ldat#1 is greater than the spacing between the first complementary local data line Ldat#1 and the fourth complementary local data line Ldat#4, and the spacing between the fourth complementary local data line Ldat#4 and the third complementary local data line Ldat#3 is greater than the spacing between the first complementary local data line Ldat#1 and the fourth complementary local data line Ldat#4, so that the noise interference on the integrated circuit 100 can be further reduced and the reliability of data transmission is improved.

Figure 5:
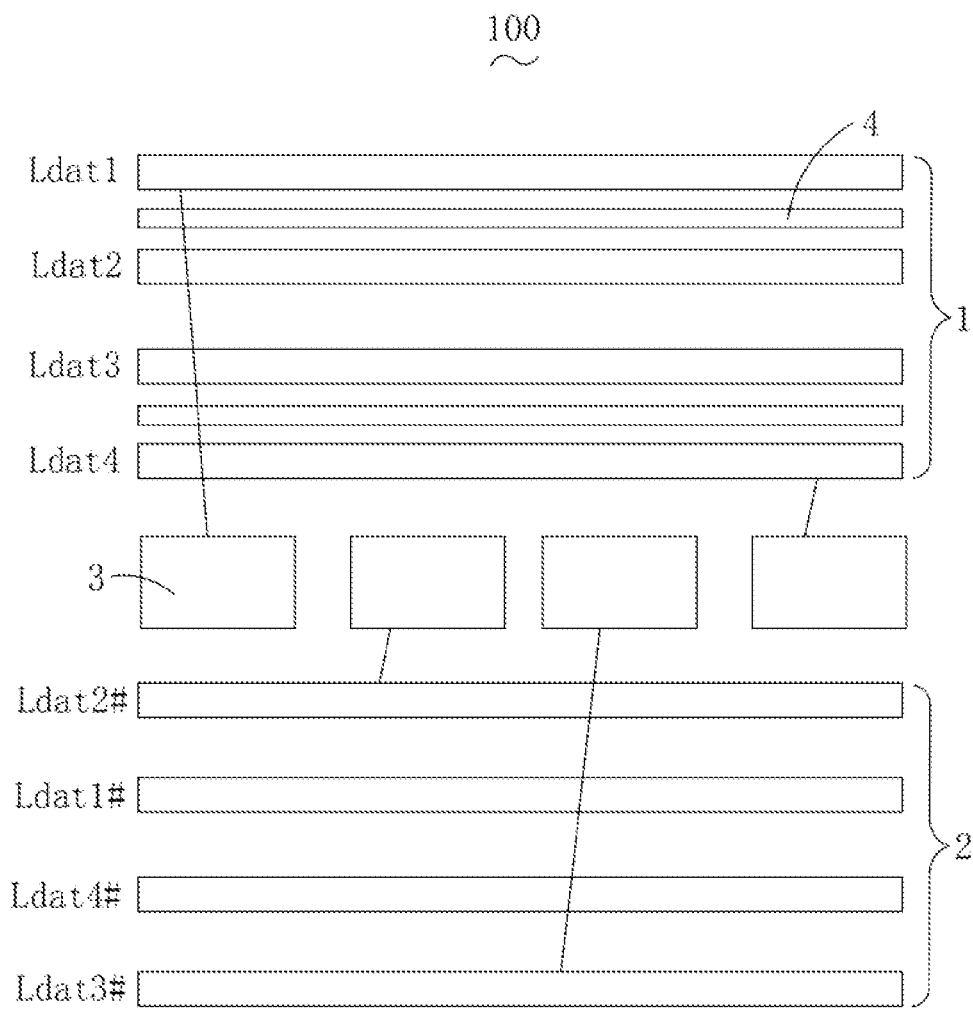
FIG. 5 illustrates another schematic structural diagram of an integrated circuit provided by an embodiment of the disclosure.

With reference to FIG. 5, the integrated circuit 100 further includes shield lines 4, and the shield lines 4 are respectively provided between the first local data line Ldat1 and the second local data line Ldat2 and between the third local data line Ldat3 and the fourth local data line Ldat4. Since the first local data line Ldat1 and the fourth local data line Ldat4 are located at the boundary positions of the first data line group 1, i.e., two read circuits 3 are respectively connected to the first local data line Ldat1 and the fourth local data line Ldat4. Through such an arrangement, the shield lines 4 can shield noise of the second local data line Ldat2 on the first local data line Ldat1 and shield noise of the third local data line Ldat3 on the fourth local data line Ldat4, thereby further improving the data reliability.

It should be noted that, as illustrated in FIG. 5, the shield lines 4 are respectively provided between the first local data line Ldat1 and the second local data line Ldat2 and between the third local data line Ldat3 and the fourth local data line Ldat4. In this embodiment, it is also allowable that the shield line 4 is only provided between the first local data line Ldat1 and the second local data line Ldat2, or the shield line 4 is only provided between the third local data line Ldat3 and the fourth local data line Ldat4, which is not specifically limited.

Figure 6:
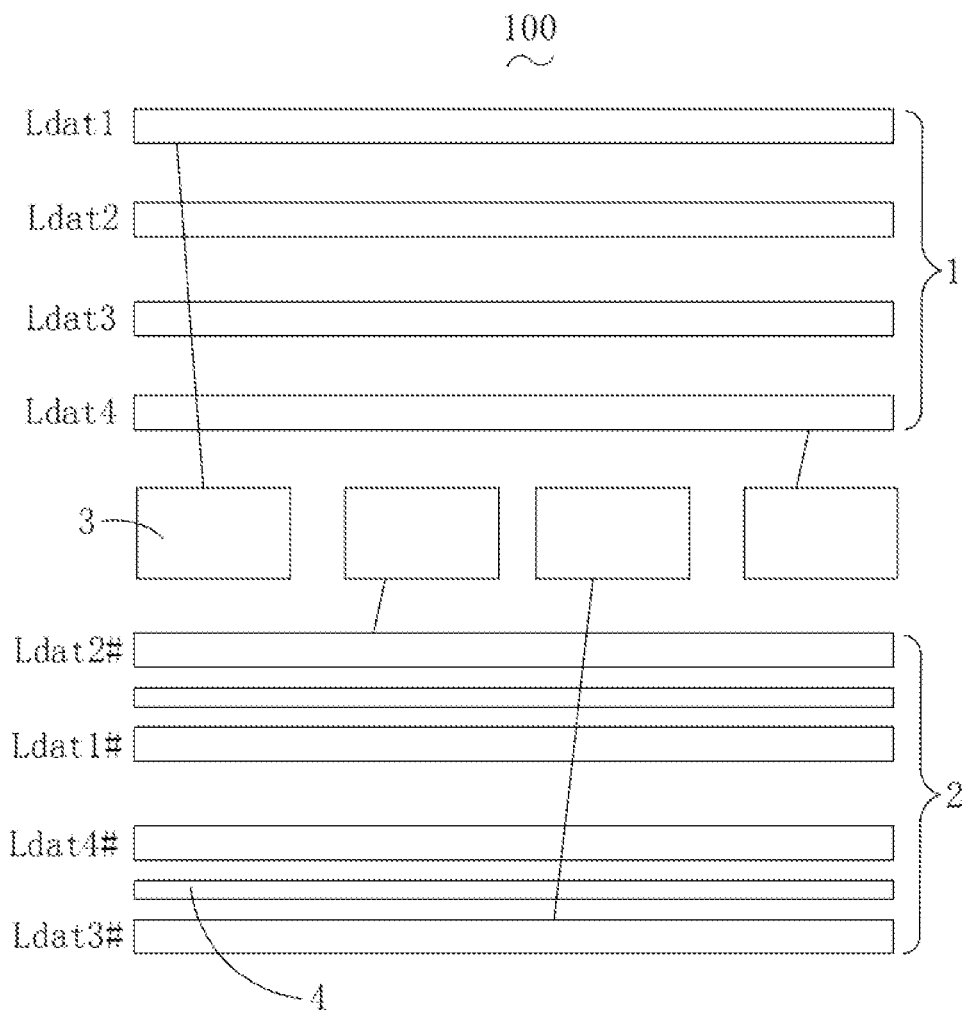
FIG. 6 illustrates another schematic structural diagram of an integrated circuit provided by an embodiment of the disclosure.

With reference to FIG. 6, the integrated circuit 100 further includes shield lines 4; and the shield lines 4 are respectively provided between the second complementary local data line Ldat#2 and the first complementary local data line Ldat#1 and between the fourth complementary local data line Ldat#4 and the third complementary local data line Ldat#3. Since the second complementary local data line Ldat#2 and the third complementary local data line Ldat#3 are located at the boundary positions of the second data line group 2, i.e., two read circuits 3 are respectively connected to the second complementary local data line Ldat#2 and the third complementary local data line Ldat#3. Through such an arrangement, the shield lines 4 can shield noise of the first complementary local data line Ldat#1 on the second complementary local data line Ldat#2 and shield noise of the fourth complementary local data line Ldat#4 on the third complementary local data line Ldat#3, thereby further improving the data reliability.

It should be noted that, as illustrated in FIG. 6, the shield lines 4 are respectively provided between the second complementary local data line Ldat#2 and the first complementary local data line Ldat#1 and between the fourth complementary local data line Ldat#4 and the third complementary local data line Ldat#3. In this embodiment, it is also allowable that the shield line 4 is only provided between the second complementary local data line Ldat#2 and the first complementary local data line Ldat#1 or the shield line 4 is only provided between the fourth complementary local data line Ldat#4 and the third complementary local data line Ldat#3, which is not specifically limited.

Figure 7:
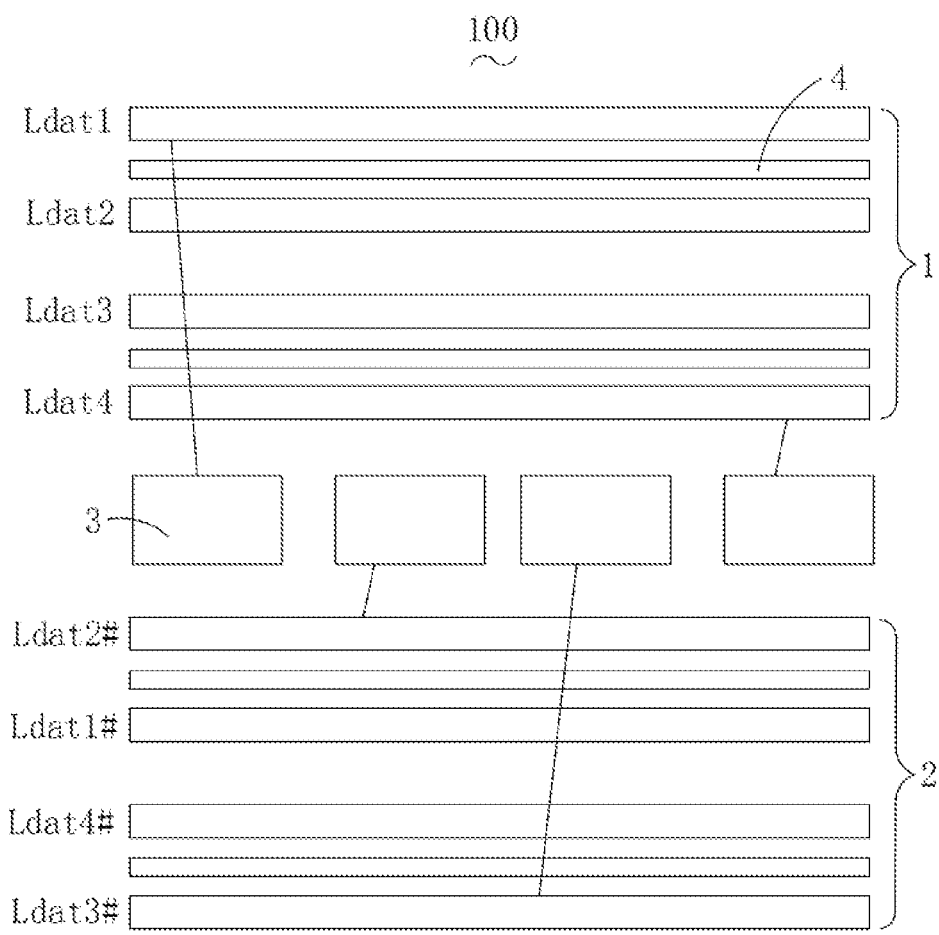
FIG. 7 illustrates a schematic structural diagram of an integrated circuit provided by an implementation of the disclosure.

With reference to FIG. 7, to enable the power consumption of the integrated circuit 100 lower, by combining the set positions of the shield lines 4 in FIG. 5 and FIG. 6, the shield lines 4 are respectively provided between the first local data line Ldat1 and the second local data line Ldat2, between the third local data line Ldat3 and the fourth local data line Ldat4, between the second complementary local data line Ldat#2 and the first complementary local data line Ldat#1, and between the fourth complementary local data line Ldat#4 and the third complementary local data line Ldat#3, so as to further improve the data reliability, reduce the power consumption of the integrated circuit 100, and make the performance of the integrated circuit 100 better.

Figure 8:
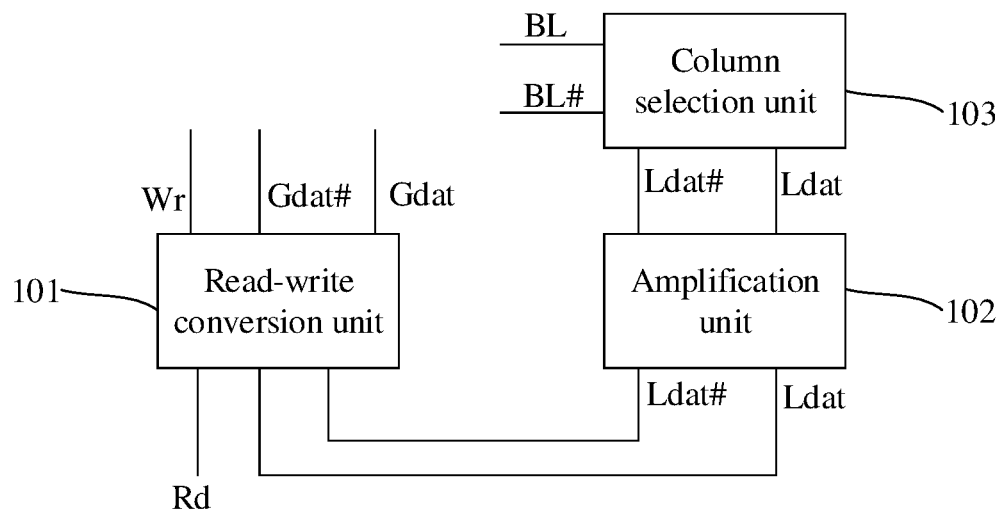
FIG. 8 illustrates a schematic diagram of functional modules of an integrated circuit provided by an embodiment of the disclosure.

With reference to FIG. 8, the integrated circuit 100 further includes a plurality of global data lines Gdat and a plurality of complementary global data lines Gdat#. The global data lines Gdat and the complementary global data lines Gdat# transmit signals having opposite phases, and the read circuits 3 are configured to transmit, in response to the read control signal, the signals of the local data lines Ldat or the complementary local data lines Ldat# to the global data lines Gdat or the complementary global data lines Gdat# during the read operation.

In addition, the integrated circuit 100 further includes a plurality of amplification units 102. The plurality of amplification units 102 are respectively connected between the local data lines Ldat and the corresponding complementary local data lines Ldat# and configured to amplify the signals of the local data lines Ldat and the signals of the complementary local data lines Ldat#.

Specifically, the integrated circuit 100 includes a read-write conversion unit 101, the amplification units 102, and a column selection unit 103. The read circuits 3 belong to the read-write conversion unit 101, and the read-write conversion unit 101 further includes write units. The write units are connected to both the local data lines Ldat and the complementary local data lines Ldat#, and the write units transmit, in response to a write control signal, signals of the global data lines Gdat and/or the complementary global data lines Gdat# to the local data lines Ldat and/or the complementary local data lines Ldat# during a write operation.

More specifically, a local data line Ldat is connected to a bit line BL through the column selection unit 103, and a complementary local data line Ldat# is electrically connected to a complementary bit line BL# through the column selection unit 103. In response to a read-write control signal, the read-write conversion unit 101 transmits data between the local data lines Ldat and the global data lines Gdat and transmits data between the complementary local data lines Ldat# and the complementary global data lines Gdat# during a read-write operation. The amplification units 102 are connected between the local data lines Ldat and the complementary local data lines Ldat#, and configured to amplify data of the local data lines Ldat and data of the complementary local data lines Ldat#.

The read-write control signal includes a read control signal Rd and a write control signal Wr. During the read-write operation, in response to the read control signal Rd, the read-write conversion unit 101 transmits the data of the local data lines Ldat and the complementary local data lines Ldat# to the global data lines Gdat and the complementary global data lines Gdat#, or in response to the write control signal Wr, the read-write conversion unit 101 transmits data of the global data lines Gdat and the complementary global data lines Gdat# to the local data lines Ldat and the complementary local data lines Ldat#.

The amplification units 102 constitute circuits for amplifying the signals of the local data lines Ldat and amplifying the signals of the complementary local data lines Ldat#, so as to facilitate distinguishing the local data lines Ldat from the complementary local data lines Ldat#, thereby increasing the data signal transmission speed and the data read-write speed. In addition, since the data signals of the local data lines Ldat and the complementary local data lines Ldat# are amplified, demands of the local data lines Ldat and the complementary local data lines Ldat# on the driving capability of the first-stage amplification circuits in a memory are reduced. Therefore, even if the areas of the first-stage amplification circuits are gradually decreased, the first-stage amplification circuits still have the adequate driving capability for the local data lines Ldat and the complementary local data lines Ldat#, so as to ensure good electrical performance of the read-write conversion circuit while satisfying the device miniaturization development trend, and further improve the storage performance of the memory including the read-write conversion circuit.

Figure 9:
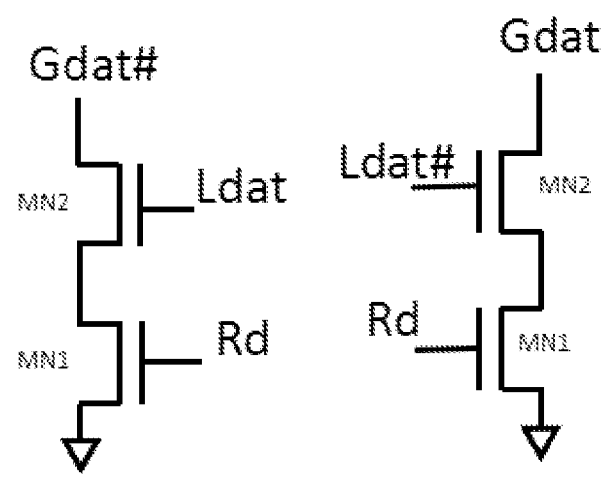
FIG. 9 illustrates a schematic circuit structural diagram of an integrated circuit provided by an embodiment of the disclosure.

With reference to FIG. 9, each read circuit 3 includes a first N-channel metal oxide semiconductor (NMOS) transistor MN1 and a second NMOS transistor MN2. The source of the first NMOS transistor MN1 is grounded, the drain is electrically connected to the source of the second NMOS transistor MN2, and the gate receives the read control signal Rd. The gate of the second NMOS transistor MN2 is electrically connected to the local data line Ldat or the complementary local data line Ldat#, and the drain is electrically connected to the complementary global data line Gdat# or the global data line Gdat.

Figure 10:
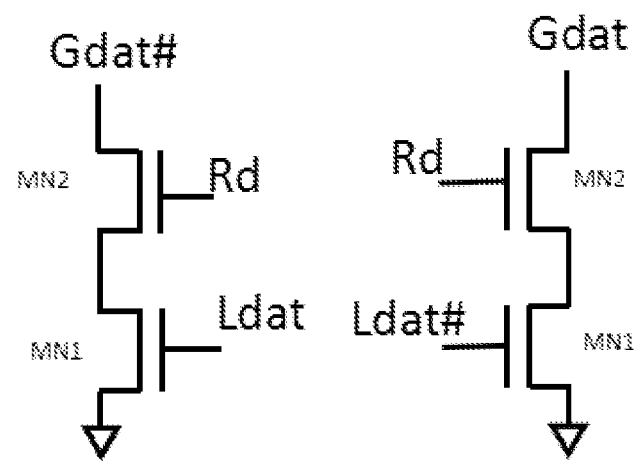
FIG. 10 illustrates another schematic circuit structural diagram of an integrated circuit provided by an embodiment of the disclosure.

With reference to FIG. 10, each read circuit 3 includes a first NMOS transistor MN1 and a second NMOS transistor MN2. The source of the first NMOS transistor MN1 is grounded, the drain is electrically connected to the source of the second NMOS transistor MN2, and the gate is electrically connected to the local data line Ldat or the complementary local data line Ldat#. The gate of the second NMOS transistor MN2 receives the read control signal Rd, and the drain is electrically connected to the complementary global data line Gdat# or the global data line Gdat.

Figure 11:
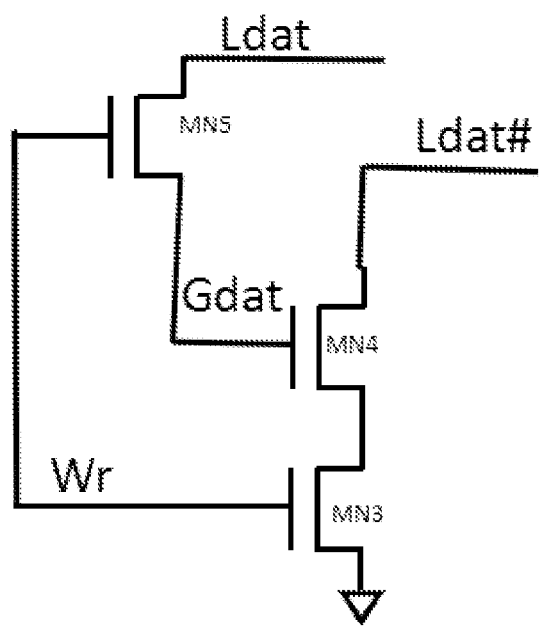
FIG. 11 illustrates another schematic circuit structural diagram of an integrated circuit provided by an embodiment of the disclosure.

With reference to FIG. 11, each write circuit includes a third NMOS transistor MN3, a fourth NMOS transistor MN4, and a fifth NMOS transistor MN5. The source of the third NMOS transistor MN3 is grounded, the gate receives the write control signal Wr, and the drain is electrically connected to the source of the fourth NMOS transistor MN4. The gate of the fourth NMOS transistor MN4 is electrically connected to the global data line Gdat, and the drain is electrically connected to the complementary local data line Ldat#. The source of the fifth NMOS transistor MN5 is electrically connected to the global data line Gdat, the gate receives the write control signal Wr, and the drain is electrically connected to the local data line Ldat.

Figure 12:
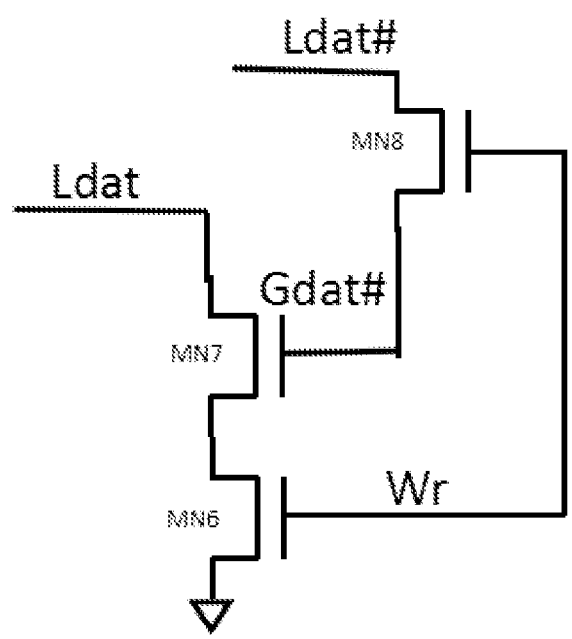
FIG. 12 illustrates another schematic circuit structural diagram of an integrated circuit provided by an embodiment of the disclosure.

With reference to FIG. 12, each write unit includes a sixth NMOS transistor MN6, a seventh NMOS transistor MN7, and an eighth NMOS transistor MN8. The source of the sixth NMOS transistor MN6 is grounded, the gate receives the write control signal Wr, and the drain is electrically connected to the source of the seventh NMOS transistor MN7. The gate of the seventh NMOS transistor MN7 is electrically connected to the complementary global data line Gdat#, and the drain is electrically connected to the local data line Ldat. The source of the eighth NMOS transistor MN8 is electrically connected to the complementary global data line Gdat#, the gate receives the write control signal Wr, and the drain is electrically connected to the complementary local data line Ldat#.

Figure 13:
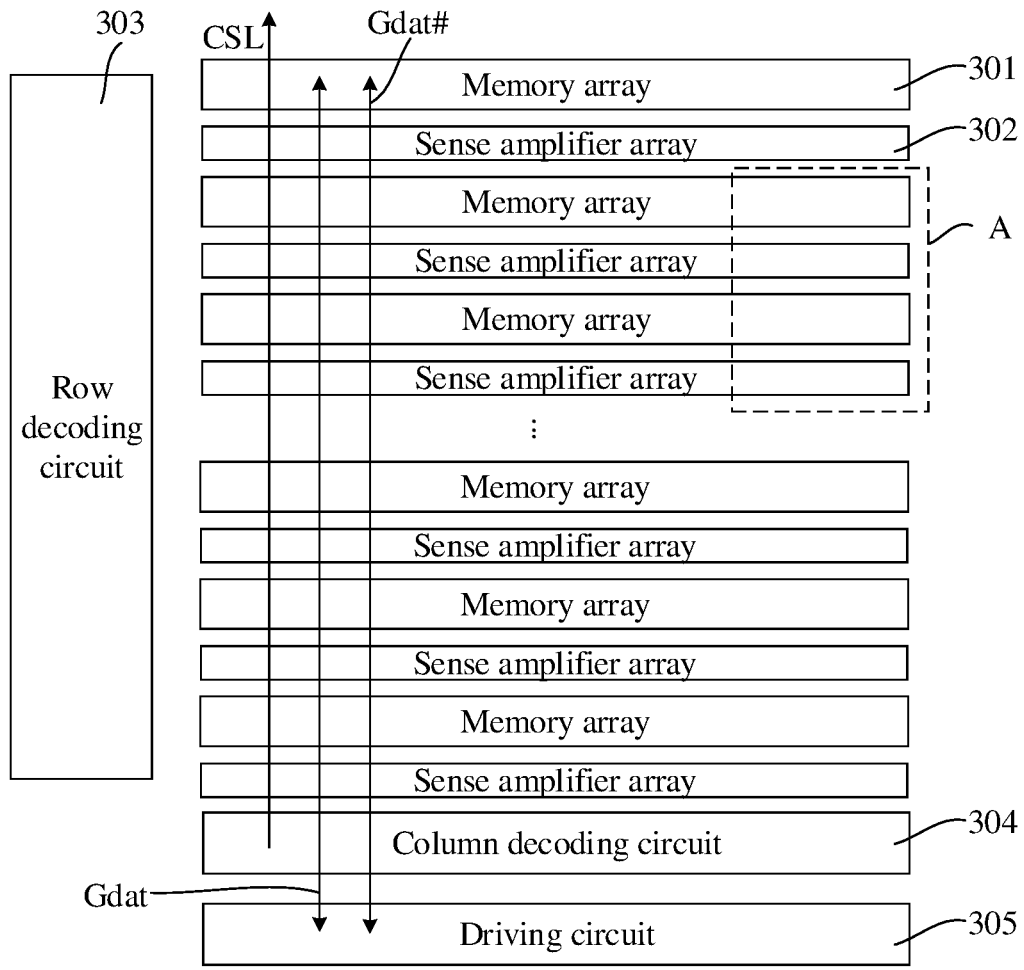
FIG. 13 illustrates a schematic structural diagram of a memory provided by an embodiment of the disclosure.
Figure 14:
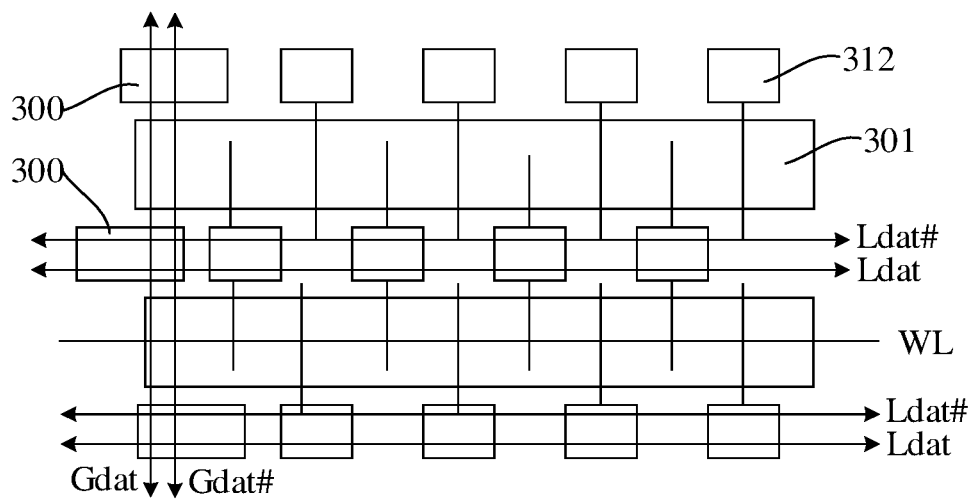
FIG. 14 illustrates a partial enlarged schematic structural diagram of region A in FIG. 13.

Correspondingly, embodiments of the disclosure further provide a memory, including the read-write conversion circuit in any of the above embodiments. FIG. 13 illustrates a schematic structural diagram of a memory provided by an embodiment of the disclosure. FIG. 14 illustrates a partial enlarged schematic structural diagram of region A in FIG. 13.

With reference to FIG. 13 and FIG. 14, the memory includes: several storage modules, where each storage module includes a memory array 301 and a sense amplifier array 302, the sense amplifier array 302 includes a plurality of sense amplifiers 312, and the memory array 301 includes a plurality of memory cells; a column selection signal line CSL; word lines WL; read-write conversion circuits 300, where each read-write conversion circuit 300 is connected to the corresponding sense amplifier array 302, and each read-write conversion circuit 300 includes the local data lines Ldat, the complementary local data lines Ldat#, the global data lines Gdat, and the complementary global data lines Gdat#; a row decoding circuit 303; a column decoding circuit 304; and a driving circuit 305.

The memory is described below in combination with the working mechanism of the memory.

When one word line WL is selected through the row decoding circuit 303, data in the memory array 301 corresponding to the word line WL is transmitted to the sense amplifiers 312, amplified by the sensor amplifiers 312, and then written back to the memory cells connected to the selected word line WL.

When data needs to be written, the column decoding circuit 304 selects the corresponding sense amplifier 312, and the data is transmitted from the global data line Gdat and the complementary global data line Gdat# to the local data line Ldat and the complementary local data line Ldat# through the read-write conversion circuit 300 and then written into the corresponding sense amplifier 312 and the memory cell connected to the sense amplifier 312. During the write operation, the read-write conversion circuit 300 not only has a signal transmission function, but also can amplify signals of the local data line Ldat and the complementary local data line Ldat#, thereby facilitating rapidly distinguishing the signals of the local data line Ldat from the signals of the complementary local data line Ldat#. Therefore, the data transmission speed is increased and the requirement of the read-write conversion circuit 300 for the driving capability of the sensor amplifier 312 is also reduced, so that the sense amplifier 312 with a small area can satisfy the requirement for the driving capability, thereby greatly reducing the technological difficulty of the sense amplifier 312 and meeting the tendency of the device miniaturization.

When data needs to be read, the data transmission direction is opposite to the transmission direction during the data write. The column decoding circuit 304 selects the corresponding sense amplifier 312, and the data is transmitted to the local data line Ldat and the complementary local data line Ldat# and then transmitted to the global data line Gdat and the complementary global data line Gdat# through the read-write conversion circuit 300. Similarly, when the data is read, the read-write conversion circuit 300 can greatly increase the speed of distinction between the local data line Ldat and the complementary local data line Ldat#, and the speed at which the data is transmitted to the global data line Gdat and the complementary global data line Gdat# through the sense amplifier 312, the local data line Ldat, and the complementary local data line Ldat# is increased.

It is to be understood that FIG. 13 and FIG. 14 merely illustrate a pair of the global data line and the complementary global data line. In practical use, there may be a plurality of pairs of global data lines and complementary global data lines in a memory. Similarly, in practical use, there may be a plurality of pairs of local data lines and complementary local data lines in a memory.

The memory may be a DRAM, an SRAM, an MRAM, a FeRAM, a PCRAM, an NAND, an NOR or the like. According to the above analysis, the memory provided by the embodiments has the advantage of a fast data transmission speed, and a low requirement for the driving capability of the sense amplifier, which facilitates satisfying the tendency of the device miniaturization.

Persons of ordinary skill in the art can understand that the above implementations are specific embodiments for implementing the disclosure, and in practical application, various variations can be made in form and detail without departing from the spirit and scope of the disclosure.

The invention claimed is:

1. An integrated circuit, comprising:
a first data line group, comprising a plurality of local data lines arranged in an array;
a second data line group, comprising a plurality of complementary local data lines arranged in a second array, wherein the plurality of complementary local data lines and the plurality of local data lines respectively transmit signals having opposite phases; and
a plurality of read circuits, configured to read, in response to a read control signal, signals of the plurality of local data lines or the plurality of complementary local data lines during a read operation, wherein each of the plurality of read circuits is electrically connected to a local data line of the plurality of local data lines at a boundary of the first data line group or connected to a complementary local data line of the plurality of complementary local data lines at a boundary of the second data line group;
wherein the plurality of local data lines comprise a first local data line, a second local data line, a third local data line, and a fourth local data line arranged in sequence, the plurality of complementary local data lines comprise a second complementary local data line, a first complementary local data line, a fourth complementary local data line, and a third complementary local data line arranged in sequence, and the first local data line, the fourth local data line, the second complementary local data line, and the third complementary local data line are electrically connected to one of the plurality of read circuits, respectively; and
wherein the first local data line and the first complementary local data line, the second local data line and the second complementary local data line, the third local data line and the third complementary local data line, and the fourth local data line and the fourth complementary local data line each transmit signals having opposite phases.

2. The integrated circuit of claim 1, wherein at least one of:
the plurality of local data lines are equally spaced apart; or
the plurality of complementary local data lines are equally spaced apart.

3. The integrated circuit of claim 1, wherein at least one of:
a spacing between the first local data line and the second local data line is greater than a spacing between the second local data line and the third local data line; or
a spacing between the third local data line and the fourth local data line is greater than the spacing between the second local data line and the third local data line.

4. The integrated circuit of claim 1, wherein at least one of:
a spacing between the first local data line and the second local data line is greater than a spacing between the second local data line and the third local data line; or
a spacing between the third local data line and the fourth local data line is equal to the spacing between the second local data line and the third local data line.

5. The integrated circuit of claim 1, wherein at least one of:
a spacing between the second complementary local data line and the first complementary local data line is greater than a spacing between the first complementary local data line and the fourth complementary local data line; or
a spacing between the fourth complementary local data line and the third complementary local data line is greater than the spacing between the first complementary local data line and the fourth complementary local data line.

6. The integrated circuit of claim 1, wherein at least one of:
a spacing between the second complementary local data line and the first complementary local data line is greater than a spacing between the first complementary local data line and the fourth complementary local data line; or
a spacing between the fourth complementary local data line and the third complementary local data line is equal to the spacing between the first complementary local data line and the fourth complementary local data line.

7. The integrated circuit of claim 1, further comprising: one or more shield lines;
wherein at least one of:
a shield line of the one or more shield lines is provided between the first local data line and the second local data line; or
a shield line of the one or more shield lines is provided between the third local data line and the fourth local data line.

8. The integrated circuit of claim 1, further comprising: one or more shield lines;
wherein at least one of:
a shield line of the one or more shield lines is provided between the second complementary local data line and the first complementary local data line; or
a shield line of the one or more shield lines is provided between the fourth complementary local data line and the third complementary local data line.

9. The integrated circuit of claim 1, further comprising: a plurality of shield lines;
wherein the plurality of shield lines are provided between the first local data line and the second local data line, between the third local data line and the fourth local data line, between the second complementary local data line and the first complementary local data line, and between the fourth complementary local data line and the third complementary local data line.

10. The integrated circuit of claim 1, further comprising: a plurality of global data lines and a plurality of complementary global data lines, wherein the plurality of global data lines and the plurality of complementary global data lines transmit signals having opposite phases, and the plurality of read circuits are configured to transmit, in response to the read control signal, the signals of the plurality of local data lines or the plurality of complementary local data lines to the plurality of global data lines or the plurality of complementary global data lines during the read operation.

11. The integrated circuit of claim 10, wherein each of the plurality of read circuits comprises a first N-channel metal oxide semiconductor (NMOS) transistor and a second NMOS transistor.

12. The integrated circuit of claim 11, wherein
a source of the first NMOS transistor is grounded, a drain of the first NMOS transistor is electrically connected to a source of the second NMOS transistor, and a gate of the first NMOS transistor receives the read control signal; and
a gate of the second NMOS transistor is electrically connected to one of the plurality of local data lines or one of the plurality of complementary local data lines, and a drain of the second NMOS transistor is electrically connected to one of the plurality of complementary global data lines or one of the plurality of global data lines.

13. The integrated circuit of claim 11, wherein
a source of the first NMOS transistor is grounded, a drain of the first NMOS transistor is electrically connected to a source of the second NMOS transistor, and a gate of the first NMOS transistor is electrically connected to one of the plurality of local data lines or one of the plurality of complementary local data lines; and
a gate of the second NMOS transistor receives the read control signal, and a drain of the second NMOS transistor is electrically connected to one of the plurality of complementary global data lines or one of the plurality of global data lines.

14. The integrated circuit of claim 10, further comprising: a plurality of write units, configured to transmit, in response to a write control signal, the signals of at least one of the plurality of global data lines or the plurality of complementary global data lines to at least one of the plurality of local data lines or the plurality of complementary local data lines during a write operation.

15. The integrated circuit of claim 14, wherein each write unit of the plurality of write units comprises a third NMOS transistor, a fourth NMOS transistor, and a fifth NMOS transistor;
a source of the third NMOS transistor is grounded, a gate of the third NMOS transistor receives the write control signal, and a drain of the third NMOS transistor is electrically connected to a source of the fourth NMOS transistor;
a gate of the fourth NMOS transistor is electrically connected to one of the plurality of global data lines, and a drain of the fourth NMOS transistor is electrically connected to one of the plurality of complementary local data lines; and
a source of the fifth NMOS transistor is electrically connected to the one of the plurality of global data lines, a gate of the fifth NMOS transistor receives the write control signal, and a drain of the fifth NMOS transistor is electrically connected to one of the plurality of local data lines.

16. The integrated circuit of claim 14, wherein each write unit of the plurality of write units comprises a sixth NMOS transistor, a seventh NMOS transistor, and an eighth NMOS transistor;
a source of the sixth NMOS transistor is grounded, a gate of the sixth NMOS transistor receives the write control signal, and a drain of the sixth NMOS transistor is electrically connected to a source of the seventh NMOS transistor;
a gate of the seventh NMOS transistor is electrically connected to one of the plurality of complementary global data lines, and a drain of the seventh NMOS transistor is electrically connected to one of the plurality of local data lines; and
a source of the eighth NMOS transistor is electrically connected to the one of the plurality of complementary global data lines, a gate of the eighth NMOS transistor receives the write control signal, and a drain of the eighth NMOS transistor is electrically connected to one of the plurality of complementary local data lines.

17. The integrated circuit of claim 1, further comprising: a plurality of amplification units, respectively connected between the plurality of local data lines and a corresponding one of the plurality of complementary local data lines and configured to amplify the signals of the plurality of local data lines and the signals of the plurality of complementary local data lines.

18. The integrated circuit of claim 1, further comprising: a column selection unit, wherein one of the plurality of local data lines is connected to a bit line through the column selection unit, and one of the plurality of complementary local data lines is electrically connected to a complementary bit line through the column selection unit.

19. An integrated circuit, comprising:
a first data line group, comprising a plurality of local data lines arranged in an array;
a second data line group, comprising a plurality of complementary local data lines arranged in a second array, wherein the plurality of complementary local data lines and the plurality of local data lines respectively transmit signals having opposite phases;
a plurality of read circuits, configured to read, in response to a read control signal, signals of the plurality of local data lines or the plurality of complementary local data lines during a read operation, wherein each of the plurality of read circuits is electrically connected to a local data line of the plurality of local data lines at a boundary of the first data line group or connected to a complementary local data line of the plurality of complementary local data lines at a boundary of the second data line group; and
a plurality of global data lines and a plurality of complementary global data lines, wherein the plurality of global data lines and the plurality of complementary global data lines transmit signals having opposite phases, and the plurality of read circuits are configured to transmit, in response to the read control signal, the signals of the plurality of local data lines or the plurality of complementary local data lines to the plurality of global data lines or the plurality of complementary global data lines during the read operation;
wherein each of the plurality of read circuits comprises a first N-channel metal oxide semiconductor (NMOS) transistor and a second NMOS transistor,
a source of the first NMOS transistor is grounded, a drain of the first NMOS transistor is electrically connected to a source of the second NMOS transistor, and a gate of the first NMOS transistor receives the read control signal; and
a gate of the second NMOS transistor is electrically connected to one of the plurality of local data lines or one of the plurality of complementary local data lines, and a drain of the second NMOS transistor is electrically connected to one of the plurality of complementary global data lines or one of the plurality of global data lines.

20. An integrated circuit, comprising:
a first data line group, comprising a plurality of local data lines arranged in an array;
a second data line group, comprising a plurality of complementary local data lines arranged in a second array, wherein the plurality of complementary local data lines and the plurality of local data lines respectively transmit signals having opposite phases;
a plurality of read circuits, configured to read, in response to a read control signal, signals of the plurality of local data lines or the plurality of complementary local data lines during a read operation, wherein each of the plurality of read circuits is electrically connected to a local data line of the plurality of local data lines at a boundary of the first data line group or connected to a complementary local data line of the plurality of complementary local data lines at a boundary of the second data line group;
a plurality of global data lines and a plurality of complementary global data lines, wherein the plurality of global data lines and the plurality of complementary global data lines transmit signals having opposite phases, and the plurality of read circuits are configured to transmit, in response to the read control signal, the signals of the plurality of local data lines or the plurality of complementary local data lines to the plurality of global data lines or the plurality of complementary global data lines during the read operation; and
a plurality of write units, configured to transmit, in response to a write control signal, the signals of at least one of the plurality of global data lines or the plurality of complementary global data lines to at least one of the plurality of local data lines or the plurality of complementary local data lines during a write operation;

wherein each write unit of the plurality of write units comprises a third NMOS transistor, a fourth NMOS transistor, and a fifth NMOS transistor;
a source of the third NMOS transistor is grounded, a gate of the third NMOS transistor receives the write control signal, and a drain of the third NMOS transistor is electrically connected to a source of the fourth NMOS transistor;
a gate of the fourth NMOS transistor is electrically connected to one of the plurality of global data lines, and a drain of the fourth NMOS transistor is electrically connected to one of the plurality of complementary local data lines; and
a source of the fifth NMOS transistor is electrically connected to the one of the plurality of global data lines, a gate of the fifth NMOS transistor receives the write control signal, and a drain of the fifth NMOS transistor is electrically connected to one of the plurality of local data lines.

* * * * *